United States Patent
Iba et al.

(10) Patent No.: US 9,611,426 B2
(45) Date of Patent: Apr. 4, 2017

(54) CERAMIC COMPOSITE FOR LIGHT CONVERSION AND LIGHT-EMITTING DEVICE USING SAME

(71) Applicant: Ube Industries, Ltd., Ube-shi (JP)

(72) Inventors: Hisayoshi Iba, Ube (JP); Shinichi Ishitobi, Ube (JP); Yasuyuki Ichizono, Ube (JP)

(73) Assignee: Ube Industries, Ltd., Ube-shi (JP)

( * ) Notice: Subject to any disclaimer, the term of this patent is extended or adjusted under 35 U.S.C. 154(b) by 338 days.

(21) Appl. No.: 14/387,738

(22) PCT Filed: Mar. 28, 2013

(86) PCT No.: PCT/JP2013/059204
§ 371 (c)(1),
(2) Date: Sep. 24, 2014

(87) PCT Pub. No.: WO2013/146994
PCT Pub. Date: Oct. 3, 2013

(65) Prior Publication Data
US 2015/0048401 A1    Feb. 19, 2015

(30) Foreign Application Priority Data

Mar. 30, 2012 (JP) .................................. 2012-078654

(51) Int. Cl.
| | |
|---|---|
| C09K 11/80 | (2006.01) |
| C09K 11/08 | (2006.01) |
| H01L 33/50 | (2010.01) |
| C09K 11/77 | (2006.01) |
| C04B 35/117 | (2006.01) |
| C04B 35/44 | (2006.01) |
| C04B 35/65 | (2006.01) |

(52) U.S. Cl.
CPC ........ C09K 11/7774 (2013.01); C04B 35/117 (2013.01); C04B 35/44 (2013.01); C04B 35/652 (2013.01); H01L 33/502 (2013.01); C04B 2235/3224 (2013.01); C04B 2235/3225 (2013.01); C04B 2235/3229 (2013.01); C04B 2235/764 (2013.01); C04B 2235/80 (2013.01); H01L 2224/16225 (2013.01); Y02B 20/181 (2013.01)

(58) Field of Classification Search
CPC . C09K 11/025; C09K 11/7721; H01L 33/502; C04B 35/50; C04B 35/111; C04B 2111/807
See application file for complete search history.

(56) References Cited

U.S. PATENT DOCUMENTS

| | | | | |
|---|---|---|---|---|
| 8,044,572 | B2 * | 10/2011 | Sakata | ............... C04B 35/117 313/467 |
| 8,940,187 | B2 * | 1/2015 | Ohtsubo | ............... C04B 35/117 252/301.4 R |
| 2012/0045634 | A1 | 2/2012 | Irie et al. | |
| 2012/0068213 | A1 | 3/2012 | Zhang et al. | |

FOREIGN PATENT DOCUMENTS

| | | |
|---|---|---|
| EP | 1837921 A1 | 9/2007 |
| EP | 1980606 A1 | 10/2008 |
| JP | 2000208815 A | 7/2000 |
| WO | 0108453 A1 | 2/2001 |
| WO | 2004065324 A1 | 8/2004 |
| WO | 2006001316 A1 | 1/2006 |
| WO | 2007083828 A1 | 7/2007 |
| WO | 2011125422 A1 | 10/2011 |
| WO | WO 2011/125422 | * 10/2011 |

OTHER PUBLICATIONS

Lui et al., "Selectively excited emission and Tb3+→Ce3+ energy transfer in yttrium aluminium garnet", Physical Review B, 1989, pp. 10633-10639, vol. 39, No. 15.

Pan et al., "Tailored photoluminescence of YAG:CE phosphor through various methods", Journal of Physics and Chemistry of Solids, 2004, pp. 845-850, vol. 65.

Ichikawa et al., "The Present State and the Future of White LED Using Rare Earth Phosphor", Material Integration, 2003, pp. 41-46, vol. 16, No. 7.

"GaN series Light Emitting Diode for Light Source of Illuminator", Applied Physics, 2002, pp. 1518-1522, vol. 71, No. 12.

* cited by examiner

Primary Examiner — Carol M Koslow
(74) Attorney, Agent, or Firm — The Webb Law Firm (57) ABSTRACT

A ceramic composite for light conversion, which can make the fluorescence dominant wavelength longer up to 580 nm, further arbitrarily adjust the wavelength in the range of 570 to 580 nm, and undergoes no decrease in fluorescence intensity even when the fluorescence dominant wavelength is made longer, with luminescence unevenness suppressed. A light-emitting device comprising ceramic composite mentioned above. The ceramic composite for light conversion is a solidified body including a composition expressed by the following formula (1), where the composition has a structure where at least two oxide phases of a first phase and a second phase are continuously and three-dimensionally entangled mutually, and the ceramic composite for light conversion is characterized in that the first phase is a $(Tb, Y)_3Al_5O_{12}$ phase activated with Ce for producing fluorescence, whereas the second phase is an $Al_2O_3$ phase.

10 Claims, 3 Drawing Sheets

CERAMIC COMPOSITE FOR LIGHT CONVERSION AND LIGHT-EMITTING DEVICE USING SAME

CROSS-REFERENCE TO RELATED APPLICATIONS

This application is the United States national phase of International Application No. PCT/JP2013/059204 filed Mar. 28, 2013, and claims priority to Japanese Patent Application No. 2012-078654 filed Mar. 30, 2012, the disclosures of which are hereby incorporated in their entirety by reference.

TECHNICAL FIELD

The present invention relates to a ceramic composite for light conversion, for use in a light-emitting device such as a light-emitting diode, which can be used for displays, lighting apparatuses, and backlight sources, etc.

BACKGROUND ART

In recent years, research and development have been actively carried out regarding white light-emitting devices using blue light-emitting elements as light-emitting sources. In particular, the demand for white light-emitting diodes using blue light-emitting diode elements has been expected to be rapidly expanded from now on because the diodes are light in weight and long in lifetime, without using mercury. It is to be noted that a light-emitting device using a light-emitting diode element as a light-emitting element is referred to as a light-emitting diode (LED). The method adopted most commonly as a method for converting blue light from a blue light-emitting diode element to white light is intended to obtain white light in a pseudo-manner by mixing blue light with yellow light that has a complementary relationship with the blue light. As described in, for example, Patent Literature 1, a white light-emitting diode can be configured in a way that a coating layer containing a phosphor that absorbs some of blue light and emits yellow light is provided over the entire surface of a diode element that emits blue light, and a molded layer or the like is arranged ahead thereof for mixing blue light from the light source with yellow light from the phosphor. A YAG ($Y_3Al_5O_{12}$) powder activated with cerium (which may be hereinafter referred to as YAG: Ce in some cases) or the like is used as the phosphor.

In the case of a white light-emitting device using a blue light-emitting diode element and a YAG: Ce phosphor, light from a blue light-emitting diode element commonly used today has a blue light with a peak wavelength around 460 nm (for example, CIE 1391 chromaticity coordinates (which may be hereinafter referred to simply as chromaticity in some cases) Cx=0.135 and Cy=0.08). This is because the luminescent efficiency of the YAG: Ce phosphor is increased in this wavelength range. On the other hand, the color from a phosphor of YAG: Ce with an emission wavelength unadjusted (which may be hereinafter referred to as an unadjusted YAG: Ce in some cases) is a yellow color with a peak wavelength around 530 to 545 nm (for example, chromaticity Cx=0.41 and Cy=0.56). For this reason, when light around 460 nm from the blue light-emitting diode element is mixed in color with light from the unadjusted YAG: Ce phosphor, the obtained light will deviate from white light (for example, 6000 K: chromaticity Cx=0.32 and Cy=0.34) toward a green color. Therefore, in order to obtain a white color from this configuration, there is a need to use a YAG: Ce phosphor with a fluorescence peak wavelength on the further red side (longer wavelength side).

In addition, since white light-emitting diodes vary in required chromaticity range (color temperature), depending on the intended use such as displays, lights, and backlight sources, it is necessary to select the phosphor also in response to the intended use. Furthermore, in order to stabilize the chromaticity of the LED, it is desirable to use one type of phosphor, rather than the concurrent use of a plurality of phosphors. Therefore, in the case of a YAG: Ce phosphor that has a broad fluorescence spectrum, it is essential for the fluorescence dominant wavelength to be set within the required range, as a standard of the emission wavelength. Typically, adjustments to the emission wavelengths are carried out by shifting the peak wavelengths of phosphor materials to the longer wavelength side or shorter wavelength side.

As a method for shifting the peak wavelength of a phosphor material, for example, it is known as a known technique that the peak at a fluorescence wavelength of a YAG: Ce phosphor can be shifted on the order of 10 nm to the longer wavelength side by increasing or decreasing the amount of Ce as an activation agent (Non Patent Literature 1). In addition, it is known as a known technique that the peak of a fluorescence wavelength is shifted to the longer wavelength side by partially substituting an element Y with an element Gd (Non Patent Literatures 2 and 3). Patent Literature 1 proposes a method for obtaining a white color (chromaticity Cx=0.33 and Cy=0.33), in a way that the YAG: Ce phosphor with the fluorescence wavelength adjusted to the longer wavelength side in this way is combined with a blue light-emitting diode element to constitute a white light-emitting diode.

On the other hand, the inventors have proposed a ceramic composite for light conversion, which includes a solidified body formed so that a plurality of oxide phases including a YAG: Ce fluorescent phase and an $Al_2O_3$ phase are continuously and three-dimensionally entangled mutually, and a white light-emitting device including a combination of a blue light-emitting element and the ceramic composite for light conversion (Patent Literature 2). The ceramic composite for light conversion can stably achieve homogeneous yellow fluorescence because the YAG: Ce fluorescent phase is uniformly distributed, and has excellent heat resistance because of being made of ceramic. Furthermore, because the $Al_2O_3$ phase is a main constituent phase of oxide, the composite has advantages such as better heat conduction than that of a resin dispersion system and resistance to ultraviolet light. In addition, the configuration of a white light-emitting device requires no resin, because the composite per se is a bulk body. For this reason, white light-emitting devices using the ceramic composite for light conversion vary insignificantly, and are extremely preferred for achieving higher output.

Also as for the ceramic composite for light conversion as described in Patent Literature 2, the inventors have demonstrated that the peak at a fluorescence wavelength can be adjusted in the range of 550 to 560 nm or 540 to 580 nm by adjusting the entire composition of the solidified body as described in Patent Literature 3. However, in the case of a ceramic composite for light conversion, which is obtained by the unidirectional solidification method described in Patent Literature 3, it has been found that when the proportion of Gd or Ce is increased to adjust the fluorescence wavelength to the longer wavelength side, phases other than the YAG: Ce fluorescent phase and YAG: (Gd, Ce) fluorescent phase as well as the $Al_2O_3$ phase may be produced to decrease the value (total radiant flux) of spectral integral of obtained white light in some cases.

In order to deal with this problem, Patent Literature 4 suppresses the production of phases other than the YAG: Ce fluorescent phase and YAG: (Gd, Ce) fluorescent phase as well as the $Al_2O_3$ phase, thereby making it possible to obtain a ceramic composite for light conversion, which maintains a high radiant flux even when the peak at a fluorescence wavelength of the ceramic composite for light conversion is adjusted to the longer wavelength side.

CITATION LIST

Patent Literature

Patent Literature 1: JP 2000-208815 A
Patent Literature 2: WO 2004/065324 A
Patent Literature 3: WO 2007/083828 A
Patent Literature 4: WO 2011/125422 A Non Patent Literature Non Patent Literature 1: J. Physics and Chemistry of Solids, vol. 65 (2004) p. 845-850
Non Patent Literature 2: Material Integration, vol. 16, No. 7, (2003) p. 41-46
Non Patent Literature 3: Applied Physics, vol. 71, No. 12, (2002) p. 1518-1522

SUMMARY OF INVENTION

Technical Problem

However, it has been found that the ceramic composite for light conversion, which is obtained by the method described in Patent Literature 4, has the problem of luminescence unevenness produced at the light emission surface of the ceramic composite for light conversion, even when a high radiant flux is maintained by increasing the proportion of Gd or Ce, for example, adjusting the fluorescence wavelength to 570 nm or more. For this reason, a white light-emitting device using the ceramic composite for light conversion also has the problem of the luminescence unevenness increased.

Therefore, an object of the present invention is to provide a ceramic composite for light conversion, which can make the fluorescence dominant wavelength longer up to 580 nm, further arbitrarily adjust the wavelength in the range of 570 to 580 nm, and undergoes no decrease in fluorescence intensity even when the fluorescence dominant wavelength is made longer, with luminescence unevenness suppressed.

Furthermore, another object of the present invention is to provide a ceramic composite for light conversion, which is excellent in heat resistance and preferred for increasing the output of a white light-emitting device.

In addition, another object of the present invention is to provide a light-emitting device using the above-mentioned ceramic composite for light conversion.

Solution to Problem

In order to achieve the objects mentioned above, the inventors have found that, as a result of earnest studies, a ceramic composite for light conversion, which has a structure where a $(Tb, Y)_3Al_5O_{12}$ phase activated with Ce in a specific composition range for producing fluorescence and an $Al_2O_3$ phase are continuously and three-dimensionally entangled mutually, is capable of making the fluorescence dominant wavelength longer, and able to arbitrarily adjust the wavelength in the range of 570 to 580 nm, further undergoes no decrease in fluorescence intensity even when the fluorescence dominant wavelength is made longer, and can suppress luminescence unevenness, and is excellent in heat resistance, and preferred for increasing the output of a white light-emitting device, thereby achieving the present invention.

More specifically, according to a first aspect of the present invention, there is provided a ceramic composite for light conversion, which is formed of a solidified body comprising a composition expressed by the following formula (1), the composition having a structure where at least two oxide phases of a first phase and a second phase are continuously and three-dimensionally entangled mutually, the first phase being a $(Tb, Y)_3Al_5O_{12}$ phase activated with Ce for producing fluorescence, and the second phase being an $Al_2O_3$ phase.

[Formula 1]

$$AlO_{3/2} - x \cdot (a \cdot TbO_{7/4} - b \cdot YO_{3/2} - c \cdot CeO_2) \qquad (1)$$

in which x satisfies $0.23 < x < 0.30$, and a, b, and c represent mole fractions, and satisfy $0 \leq b/a \leq 4$, $0 < c \leq 0.025$, and $a+b+c=1$.

In the ceramic composite for light conversion, c in the formula (1) can satisfy $0.002 \leq c \leq 0.02$, and the ceramic composite for light conversion can have a plate shape and a thickness of 80 µm or more and 400 µm or less in a light-emitting direction.

Furthermore, the ceramic composite for light conversion can absorb light having a peak at a wavelength of 420 to 500 nm and can emit fluorescence having a dominant wavelength at 570 to 580 nm.

Furthermore, the ceramic composite for light conversion receives light having a peak at a wavelength of 420 to 500 nm, emits fluorescence converted from some of the light as excitation light, and transmits some of the light to emit transmitted light, and the fluorescence and transmitted light are mixed to emit white light.

Furthermore, in the ceramic composite for light conversion, the white light can have chromaticity in the region surrounded by (0.30, 0.32), (0.34, 0.30), (0.42, 0.41), and (0.38, 0.45) in CIE chromaticity coordinates (Cx, Cy).

According to a second aspect of the present invention, there is provided a light-emitting device including a light-emitting element and the ceramic composite for light conversion.

In addition, according to a third aspect of the present invention, there is provided a light-emitting device including a light-emitting element with a peak at a wavelength of 420 to 500 nm, and the ceramic composite for light conversion.

In the light-emitting device, the light-emitting element can be a light-emitting diode element.

Advantageous Effects of Invention

As described above, according to the present invention, there can be provided a ceramic composite for light conversion, which can make the fluorescence dominant wavelength longer up to 580 nm, and further arbitrarily adjust the wavelength in the range of 570 to 580 nm, undergoes no decrease in fluorescence intensity even when the fluorescence dominant wavelength is made longer, suppresses luminescence unevenness, is excellent in heat resistance,

DESCRIPTION OF EMBODIMENTS

A ceramic composite for light conversion and a light-emitting device using the composite according to the present invention will be described below in detail with reference to a preferred embodiment.

(Ceramic Composite for Light Conversion)

The ceramic composite for light conversion according to the present embodiment is a solidified body including a composition expressed by the following formula (1), which has a structure where at least two oxide phases of a first phase and a second phase are continuously and three-dimensionally entangled mutually, and the first phase is a $(Tb, Y)_3Al_5O_{12}$ phase activated by Ce that emits fluorescence, whereas the second phase is an $Al_2O_3$ phase.

[Mathematical Formula 2]

$$AlO_{3/2}\text{-}x\cdot(a\cdot TbO_{7/4}\text{-}b\cdot YO_{3/2}\text{-}c\cdot CeO_2) \quad (1)$$

(x satisfies $0.23 < x < 0.30$, and a, b, and c represent mole fractions, and satisfy $0 \leq b/a \leq 4$, $0 < c \leq 0.025$, and $a+b+c=1$)

Figure 1:
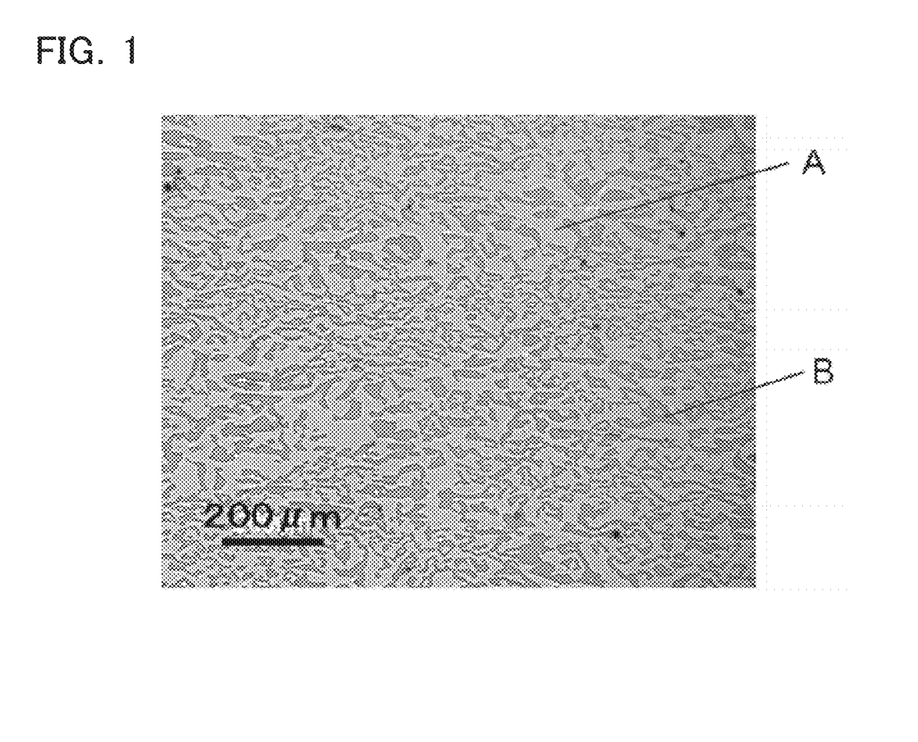
FIG. 1 is an optical micrograph showing a cross section of a ceramic composite for light conversion according to Example 1.

In the present embodiment, "the structure where the two oxide phases are continuously and three-dimensionally entangled mutually" takes on a structure as shown in section in FIG. 1, rather than a structure where the two types of oxide particles coupled to each other. In this structure, the oxide phases are in direct contact with each other, without any boundary phase such as an amorphous phase between the respective phases.

The formula (1) has therein x, a, b, and c which can be determined by the following method. First, a ground product of the ceramic composite for light conversion according to the present embodiment is melted by heating together with sodium carbonate and boric acid, and then dissolved by heating with the addition of hydrochloric acid and sulfuric acid. The dissolved matter obtained is subjected to inductively-coupled plasma atomic emission spectrometry (ICP-AES) to determine the contents of Al, Tb, Y, and Ce in terms of relative weight, and from the results, x, a, b, and c can be calculated.

"x" in the formula (1) satisfies $0.23 < x < 0.30$, preferably $0.238 \leq x \leq 0.294$. When x in the formula (1) is 0.23 or less or 0.30 or more, a coarsened region of the first phase or second phase is generated extensively in the solidified body, thereby making the solidified body likely to be cracked. In addition, even when cracking is not generated, coarsening of the first phase or second phase unfavorably causes the fluorescence dominant wavelength to vary significantly, or results in the presence of samples with luminescence unevenness unsuppressed, thus making a white light-emitting device including the ceramic composite for light conversion according to the present embodiment inappropriate as a white light-emitting device.

"b/a" in the formula (1) satisfies $0 \leq b/a \leq 4$. When b/a in the formula (1) exceeds 4, the fluorescence dominant wavelength becomes unfavorably less than 570 nm, thereby resulting in failure to achieve the effect of the increased wavelength.

"c" in the formula (1) satisfies $0 < c \leq 0.025$, preferably $0.002 \leq c \leq 0.02$. When c in the formula (1) is 0, the first phase of the ceramic composite fails to function as a fluorescent phase, because there is no activation element for producing fluorescence. Alternatively, when c is larger than 0.025, there is a need to significantly reduce the thickness of the ceramic composite for light conversion for the purpose of achieving a white light emission, for example, to a thickness less than 50 μm depending on the chromaticity range of an intended white region in applying the ceramic composite for light conversion to a white light-emitting device. In this case, it becomes difficult to achieve an appropriate white color, due to a slight difference in sample thickness. Therefore, in order to keep, at constant chromaticity, the light emission from a white light-emitting device including the ceramic composite for light conversion according to the present embodiment, which has a plate shape as will be described later, a need is created to keep the thickness of the ceramic composite for light conversion, which has a plate shape, constant with a high degree of accuracy, which is unfavorable from the perspective of quality stability. It is to be noted that the appropriate white color mentioned above refers to a white color in which blue light and yellow light are mixed in appropriate proportions and which does not contain an excessively intense yellow or blue color.

The constituent phases of the ceramic composite for light conversion according to the present embodiment can be confirmed by identifying peaks of an X-ray diffraction diagram on a powder obtained by grinding the ceramic composite for light conversion. In addition, the elements Y and Ce contained in the first phase can be confirmed through the element analysis of a mirror-like cross section by means of a field-emission scanning electron microscope. In the reflection electron image photographed in the element analysis, the first phase (($Tb, Y)_3Al_5O_{12}$ phase) and the second phase ($Al_2O_3$ phase) can be definitely identified from a difference in brightness of a monochrome image. From a constituent element mapping diagram in the same field of view as the reflection electron image, it can be determined that the distribution regions of the elements Y and Ce correspond with the region identified as the first phase and the Tb element distribution region in the reflection electron image. These indicate that Y or Ce is present in the $(Tb, Y)_3Al_5O_{12}$ phase.

In the present embodiment, oxide phases other than the first and second phases, very few if any, may be present in some cases to the extent that fluorescence characteristics will not be affected. The oxide phases other than the first and second phase typically include complex oxide phases such as a $CeAlO_3$ phase, a $CeAl_{11}O_{18}$ phase, and a $(Y, Ce)AlO_3$ phase.

The ceramic composite for light conversion according to the present embodiment can efficiently emit fluorescence with a dominant wavelength of 570 to 580 m by absorbing light (excitation light) with a peak at a wavelength of 420 to 500 nm. Because of this, yellow fluorescence can be efficiently obtained. The ceramic composite for light conversion according to the present embodiment can emit fluorescence even when the excitation light has a wavelength of 400 to 419 nm or 501 to 530 nm, while the efficiency is decreased. Moreover, even when the excitation light is near-ultraviolet light with a wavelength of 300 to 360 nm, the composite can emit fluorescence.

In the present embodiment, the dominant wavelength refers to a wavelength obtained from the intersection point of a line through two points, which are a point represented by the coordinates of a white point: Cx=0.33 and Cy=0.33 in the CIE chromaticity diagram and a point represented by the coordinate on a luminescence spectrum of the sample (ceramic composite for light conversion), and a monochromatic locus, and refers to a representative wavelength of the light. The dominant wavelength of the fluorescence can be measured by a solid quantum efficiency measurement system of FP6500 from JASCO Corporation in combination with an integrating sphere. The fluorescence dominant wavelength emitted by the ceramic composite for light conversion according to the present embodiment hardly varies depending on the proportion of $CeO_2$, that is, c in the formula (1), but can be arbitrarily adjusted in the range of 570 to 580 nm depending on x and b/a in the formula (1).

Furthermore, the ceramic composite for light conversion according to the present embodiment can receive light with a peak at a wavelength of 420 to 500 nm, emit fluorescence converted from some of the light as excitation light, and further transmit the other light to emit the transmitted light, thereby emitting white light obtained from mixture of the fluorescence and transmitted light.

The chromaticity range of the white color is not able to be rigorously defined in general because the visibility of the colors varies from individual to individual, but light in the following chromaticity range is regarded as a white color in the present embodiment. The chromaticity range is the region on the chromaticity diagram, which is located above and below a blackbody locus plotted in the range of 2500 to 15000 K of black body color temperature, and in which the deviation (Δuv) from the blackbody locus is located within approximately 0.02. The Δuv herein refers to the distance from the blackbody locus drawn on the uv chromaticity diagram to the uv chromaticity which is converted from xy chromaticity values of light. More specifically, light corresponding to 2500 to 15000 K in correlated color temperature is regarded as the white light.

The chromaticity of white light emitted by the ceramic composite for light conversion according to the present embodiment preferably falls within the region surrounded by (0.30, 0.32), (0.34, 0.30), (0.42, 0.41), and (0.38, 0.45) in CIE chromaticity coordinates (Cx, Cy), that is, within the white region in a warm color system. The ceramic composite for light conversion according to the present embodiment can emit a white color in the previously mentioned region by receiving light with a peak at a wavelength from 420 to 500 nm, and thus constitute a white light-emitting device which emits a white color in a warm color system with little luminescence unevenness.

The ceramic composite for light conversion according to the present embodiment can convert some of the received light into light of another wavelength, and emit the converted light from a light-emitting surface other than the light-receiving surface, and directly transmit the unconverted light and emit the light from the light-emitting surface other than the light-receiving surface, thus allowing the composite to serve as a light conversion member for a light-emitting device just by processing the composite. The light emission from the light-emitting device exhibits the chromaticity of the mixture of the converted fluorescence and transmitted light. The chromaticity can fall within the range of the white region.

The ceramic composite for light conversion according to the present embodiment preferably has the plate shape, because an emission surface of a light-emitting element configured in a planar surface and a principal surface of the ceramic composite for light conversion can be easily aligned to be substantially parallel to each other. In addition, the substantially fixed thickness of the ceramic composite for light conversion in a plate shape can stabilize the proportions of color mixture with a substantially uniform amount of wavelength conversion of light being transmitted, thereby suppressing luminescence unevenness at the light-emitting surface. Where the thickness of the ceramic composite for light conversion of a plate shape is increased, it is possible to increase fluorescence emitted by the first phase of the ceramic composite for light conversion, which receives excitation light emitted by the light-emitting element, thus adjusting the chromaticity of light of the excitation light and fluorescence synthesized to intended chromaticity values in the range of the white region.

Where the ceramic composite for light conversion according to the present embodiment has a plate shape, the thickness of the ceramic composite for light conversion in the light emission direction is preferably 80 μm or more and 400 μm or less. The thickness less than 80 μm in the light emission direction may not be preferred, because the thickness may make it difficult to adjust the combined light of excitation light and light emitted by the ceramic composite for light conversion to chromaticity in the range the white region, and may make luminescence unevenness likely to be caused without succeeding in obtaining an adequate mixed color due to the short optical path length. The thickness in excess of 400 μm in the light emission direction may not be preferred, because depending on the surface condition of aside surface of the ceramic composite for light conversion, light reflected by the side surface may be mixed with the emitted light to cause luminance unevenness or chromaticity unevenness (luminescence unevenness) at the light-emitting surface. In addition, the thickness in excess of 400 μm in the light emission direction may not be preferred, because depending on the configuration of the light-emitting device, light that has a relatively high proportion of the fluorescence (the proportion of yellow light is relatively high with respect to blue light) and is not white, is leaked to the side of the ceramic composite for light conversion, and the light from the side may unfavorably cause unevenness in some cases.

In the present embodiment, in particular, when the ceramic composite for light conversion having a composition represented by formula (1) where c satisfies $0.002 \leq c \leq 0.02$, being of a plate shape, and having a thickness of 80 μm or more and 400 μm or less in the light emission direction, is applied to a white light-emitting device, an appropriate white light emission can be obtained in which blue light and yellow light are mixed in appropriate proportions, and thus, the ceramic composite for light conversion is particularly preferred, which has the composition represented by the formula (1) where c satisfies $0.002 \leq c \leq 0.02$, and has a plate shape and a thickness of 80 μm or more and 400 μm or less in the light emission direction.

In the present embodiment, when a white light-emitting device using the ceramic composite for light conversion emits a light, the state in which unevenness in luminance distribution and chromaticity distribution generates in the light emission surface (light-emitting surface) is referred to as luminescence unevenness. Substantial luminescence unevenness refers to a condition in which a plurality of spots or linear regions, which substantially varies in luminance or chromaticity, are observed, where optical measuring instrument such as a two-dimensional luminance meter is focused on the light-emitting surface of the light-emitting device emitting light to measure the light, and chromatically display the result as a luminance distribution or a chromaticity distribution. In the case of this condition, when the light-emitting surface is subjected to a line analysis, there is an increased difference in luminance or chromaticity from the average on the line. On the other hand, insignificant luminescence unevenness refers to a condition in which a difference between luminance or chromaticity in a spot or linear region and the average value is small on an analysis line, or the regions are indistinguishable clearly from each other. In the case of this condition, when the light-emitting surface is subjected to a line analysis, there is a small difference in luminance or chromaticity from the average on the line.

The luminescence unevenness of the ceramic composite for light conversion is believed to be caused by segregation of a substitution element, in particular, Ce in the first phase as a fluorescent phase. The segregation refers to the local presence of a target element in a region of the crystal phase, rather than uniform distribution of the element in the phase. When there is a region with segregation of Ce as an activation element in the first phase, strong fluorescence will be produced more than necessary in the region. This fluorescence component will serve as a region that exhibits high luminance or high chromaticity at a light-emitting surface when a light-emitting element is formed, and observed as luminance unevenness or chromaticity unevenness.

Therefore, in the case of the ceramic composite for light conversion according to the present embodiment, luminescence unevenness is assumed to be suppressed because the presence of Tb makes Ce likely to be incorporated in $(Tb, Y)_3Al_5O_{12}$ phase as the first phase during the production of the composite as compared with conventional ceramic composites for light conversion, thereby increasing the uniformity element distribution in the first phase, and reducing the development of segregation.

When Gd that is larger in ionic radius than Y is added for the purpose of making the fluorescence dominant wavelength longer in a conventional ceramic composite for light conversion, luminescence unevenness will be increased as in Comparative Examples 3 and 4 as will be described later. In a conventional ceramic composite for light conversion in which Y is substituted with Gd that has an intermediate ionic radius in size between Y and Ce that are respectively smaller and larger in ionic radius, the uniformity of Ce distribution in the first phase will be reduced to increase luminescence unevenness, in exchange for the longer fluorescence dominant wavelength.

Since Tb has an intermediate ionic radius in size between Y and Ce that are respectively smaller and larger in ionic radius as in the case of Gd, and the difference in ionic radius between Tb and Gd is slight as compared with the difference between Y and Gd, it is inconceivable that Tb has an entirely different influence, rather an opposite influence from Gd on the partition (how to be incorporated from the melt into the crystal phase) of the substitution element, in light of technical common sense regarding solidification of common single crystals (materials of single crystal phases). In the present embodiment, although it is not known exactly why the presence of Tb in the melt or the first phase acted to enhance the uniformity of Ce distribution in the first phase, which is not developed by the presence of Gd, the solidification of the ceramic composite for light conversion according to the present embodiment is assumed to be accompanied by a reaction of one liquid phase (melt) and two solid phases (first phase and second phase) in equilibrium with each other, unlike solidification of common single crystals, and related to the presence of the second phase to which no activation element is distributed. Moreover, in a special reaction system such as the solidification in the present embodiment, the influence of some sort of factor other than the ionic radius on the partition of the constituent element from the liquid phase to the solid phase is believed to possibly become larger than in a reaction system of common single crystal solidification with one liquid phase and one solid phase in equilibrium with each other.

Accordingly, because the ceramic composite for light conversion according to the present embodiment is produced by a characteristic production method including solidifying a single dissolved matter homogeneously containing the activation element to form an oxide phase (first phase) in which an activation element is distributed and an oxide phase (second phase) in which no activation element is distributed, Ce is considered to be made likely to be incorporated into a $(Tb, Y)_3Al_5O_{12}$ phase as the first phase by solidifying a dissolved matter in which Ce coexists with a specific proportion of Tb in the production of the ceramic composite for light conversion according to the present embodiment. Thus, the segregation of Ce in the first phase is considered to be suppressed to suppress luminescence unevenness.

(Method for Producing Ceramic Composite for Light Conversion)

Next, a method will be described for producing the ceramic composite for light conversion according to the present embodiment.

The ceramic composite for light conversion according to the present embodiment can be prepared by melting a raw oxide that is identical to the formula (1) in composition, and solidifying the melted matter through a unidirectional solidification method under a predetermined condition. For example, a solidified body can be obtained in such a simple way that a melted matter of a raw oxide put in a crucible maintained at a predetermined temperature equal to or higher than the melting temperature (approximately 1800° C.) is condensed by cooling (solidified) while controlling the cooling rate. The unidirectional solidification method refers to a method of achieving solidification by applying an optimal temperature gradient to a solid phase/liquid phase interface to unidirectionally control crystal growth. In the unidirectional solidification method, a crystal phase included grows sequentially in a single-crystal state.

As long as the raw oxide has at least one oxide phase that is a fluorescent phase, and can prepare the composition expressed by the formula (1), the ceramic composite materials previously disclosed by the applicant (JP 7-149597 A, JP 7-187893 A, JP 8-81257 A, JP 8-253389 A, JP 8-253390 A, and JP 9-67194 A, as well as corresponding US applications (U.S. Pat. Nos. 5,569,547, 5,484,752, and 5,902,963)) can be used. The disclosures in these applications and patents are to be considered incorporated by reference herein.

The unidirectional solidification method controls the temperature decrease gradient applied in the solidification direction and the transfer rate in the solidification direction. The temperature decrease gradient refers to a temperature difference for each 1 cm of a heating means, which is measured with thermocouples or the like provided at regular intervals in a direction parallel to the solidification direction, for example, in the case of implementing the unidirectional solidification method by transferring a crucible with a melted matter contained therein, or pulling up or down the melted matter. The temperature decrease gradient is preferably 20° C./cm or more, and more preferably 25° C./cm or more. This is effective to suppress the production of oxide phases other than the first and second phases. When the temperature gradient is lower than 20° C./cm, complex oxide phases such as a $CeAlO_3$ phase and a $CeAl_{11}O_{19}$ phase may be produced which are high in percentage by volume, and when a white light-emitting device is constructed from a blue light-emitting element and the ceramic composite for light conversion according to the present invention, the total radiant flux obtained from the white light-emitting device may be reduced in some cases. In addition, the complex oxide phases described above contain Ce, and thus may decrease the amount of Ce contained in the first phase in some cases.

In addition, the transfer rate refers to the rate of transferring a crucible or the like in a direction parallel to the solidification direction, for example, in the case of implementing the unidirectional solidification method by transferring the crucible, or pulling up or down the melted matter. The transfer rate is preferably 25 mm/hour or less, more preferably 1 to 15 mm/hour. This is effective to suppress the production of oxide phases other than the first and second phases. When the transfer rate exceeds 25 mm/hour, complex oxide phases such as a $CeAlO_3$ phase and a $CeAl_{11}O_{19}$ phase may be produced which are high in percentage by volume as described previously, and when a white light-emitting device is constructed from a blue light-emitting element and the ceramic composite for light conversion according to the present invention, the total radiant flux obtained from the white light-emitting device may be reduced in some cases. In addition, the complex oxide phases containing Ce as described above are produced which are high in percentage by volume, and thus may decrease the amount of Ce contained in the first phase in some cases.

The unidirectional solidification under the condition as described above is preferred for the production of a solidified body which serves as the ceramic composite for light conversion according to the present embodiment. However, even under conditions other than the previously described condition, a solidified body which serves as the ceramic composite for light conversion according to the present embodiment can be produced as long as the first and second phase are solidified in coexistence with each other.

(Light-Emitting Device)

Next, a light-emitting device according to the present embodiment will be described.

The light-emitting device according to the present embodiment is a light-emitting device which irradiates a ceramic composite for light conversion with light emitted from a light-emitting element, and utilizes light transmitted through the ceramic composite for light conversion and fluorescence with a wavelength converted by the ceramic composite for light conversion.

Figure 2:
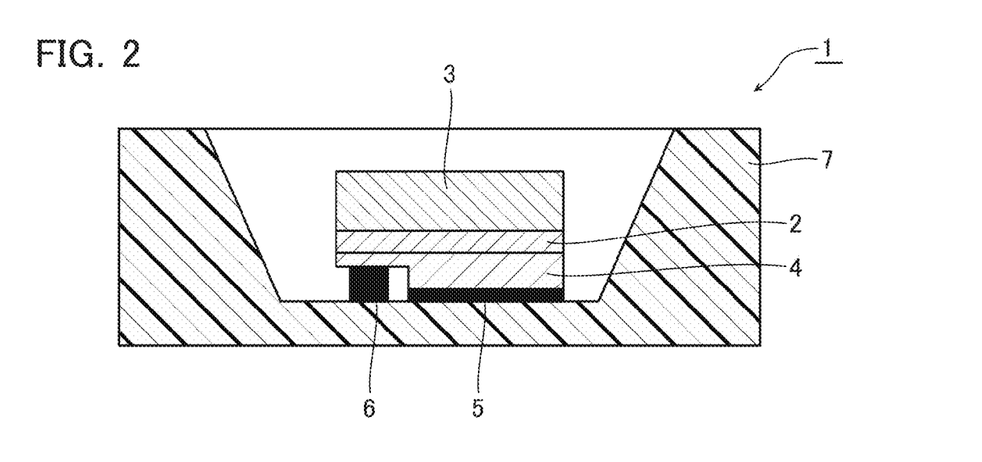
FIG. 2 is a schematic cross-sectional view illustrating an embodiment of a light-emitting device according to the present invention.

Examples of the light-emitting device according to the present embodiment include, for example, the light-emitting device 1 shown in FIG. 2. The light-emitting device 1 includes ceramic composite 3 for light conversion, which has a fluorescence dominant wavelength at a wavelength of 570 to 580 nm, and a light-emitting element 4 which emits light with a peak at 420 to 500 nm. The ceramic composite 3 for light conversion is formed in a plate shape. A single crystal substrate 2 is arranged under the ceramic composite 3 for light conversion so as to be parallel to the ceramic composite 3 for light conversion. The light-emitting element 4 is formed on the single crystal substrate 2, and connected through electrodes 5, 6 to a package 7 at another surface opposite to the substrate side. The light-emitting element 4 is an element that emits light ranging from violet to blue, and so as to obtain a white color in tune with the wavelength, light ranging violet to blue emitted from the light-emitting element 4 is transmitted through the single crystal substrate 2, and then allowed to enter the ceramic composite 3 for light conversion with a fluorescence peak wavelength adjusted. Then, yellow luminescence from the excited first phase (fluorescent phase) and transmitted light ranging violet to blue from the second phase (non-fluorescent phase) can pass through the solidified body structured so that the first phase and the second phase are continuously and three-dimensionally entangled mutually and distributed uniformly to homogeneously mix the light and obtain a white color with little luminescence unevenness.

As described above, the ceramic composite for light conversion according to the present embodiment includes the respective oxide phases containing the phosphorescent phase, which are continuously and three-dimensionally entangled mutually. Therefore, homogeneous yellow fluorescence adjusted to any fluorescence dominant wavelength of 570 to 580 nm can be efficiently and stably obtained from the ceramic composite for light conversion according to the present embodiment. Furthermore, the composite is excellent in heat resistance and durability because it is made of the oxide ceramic.

Furthermore, the light-emitting device according to the present embodiment includes the ceramic composite for light conversion according to the present embodiment, and the homogeneous yellow fluorescence with a wavelength adjusted thus makes it possible to emit white light in any color tone, and emit high-luminance homogeneous white light with little luminescence unevenness, in combination with a blue light-emitting element. Furthermore, the light-emitting device according to the present embodiment includes the ceramic composite for light conversion according to the present embodiment, and the ceramic composite for light conversion is thus per se a bulk body, which requires no sealing resin, thereby making it possible to increase the output and increase the efficiency without deterioration by heat or light.

In addition, the light-emitting device according to the present embodiment preferably includes a light-emitting diode element as the light-emitting element thereof. The ceramic composite for light conversion according to the present embodiment can be combined with a blue light-emitting diode element to constitute a highly-efficient light-emitting device.

EXAMPLES

The present invention will be described below in more detail with reference to examples. First, a method for measuring the fluorescence dominant wavelength and fluorescence intensity of the ceramic composite for light conversion, a method for identifying the constituent phases of the ceramic composite for light conversion, and a method for determining luminescence unevenness in a light-emitting device and at a light-emitting surface thereof will be described.

(Method for Measurement of Fluorescence Dominant Wavelength and Fluorescence Intensity)

On a disk-shaped sample of ϕ16 mm×0.2 mm obtained from the ceramic composite for light conversion, a fluorescence characteristic evaluation was made at an excitation light wavelength of 460 nm by means of a solid quantum efficiency measurement system from JASCO Corporation, to measure the fluorescence dominant wavelength. In addition, the fluorescence intensity was regarded as relative fluorescence intensity corresponding to a relative value in the case of regarding, as 100, the maximum fluorescence intensity in Comparative Example 1 as will be described later.

(Method for Identifying Constituent Phase of Ceramic Composite for Light Conversion)

The constituent phases of the ceramic composite for light conversion were confirmed by identifying peaks of an X-ray diffraction diagram on a powder obtained by grinding the ceramic composite for light conversion. In addition, the elements Y and Ce contained in the first phase were confirmed through the element analysis of a mirror-like cross section by means of a field-emission scanning electron microscope. Furthermore, from a constituent element mapping diagram in the same field of view as the reflection electron image, the presence of Y or Ce in the $(Tb, Y)_3Al_5O_{12}$ phase was confirmed by confirming that the distribution region of the elements Y and Ce correspond with the region identified as the first phase and the Tb element distribution region in the reflection electron image.

(Method for Measuring Chromaticity of Light Emission from Light-Emitting Device)

The light-emitting device 1 was prepared as shown in FIG. 2. The ceramic composite 3 for light conversion was the shape of a plated sample of 1 mm×1 mm×0.08 to 0.5 mm, which was obtained from the solidified body. The light-emitting element 4 was an LED for emitting blue light with a wavelength of 463 nm. The LED was allowed to emit light to irradiate the bottom of the plate-shaped sample with the blue light, and the radiant flux radiated from the surface on the side opposite to the bottom was measured in a commercially available LED measurement system with an integrating sphere. It was confirmed that the measured radiant flux indicated a value reflecting the fluorescence characteristics of the ceramic composite for light conversion. The light-emitting device was allowed to emit light to measure the chromaticity from the total luminous flux of the emitted light taken into the integrating sphere. From the chromaticity measured, it was confirmed that white light is obtained with the light-emitting device including the ceramic composite for light conversion in the shape of a plate varied in thickness.

(Method for Evaluation of Luminescence Unevenness)

Luminescence unevenness of the ceramic composite for light conversion was evaluated by the following method. Because the luminescence unevenness varies with the chromaticity of light emitted by the ceramic composite for light conversion, the chromaticity Cy to be evaluated was defined in a whiter region, and luminescence unevenness was evaluated with a light-emitting device including a ceramic composite for light conversion in the shape of a plate which was thick to emit light with the chromaticity.

The values for chromaticity Cx and Cy of light emitted by the light-emitting device are increased with the increased thickness of the ceramic composite for light conversion. For that reason, a graph with Cx and Cy as variables on two axes and a graph with the thickness of the ceramic composite for light conversion and Cy as variables on two axes were prepared to determine, from approximate lines thereof, the thickness of the ceramic composite for light conversion in a plate shape when chromaticity Cy becomes 0.35.

Figure 6:
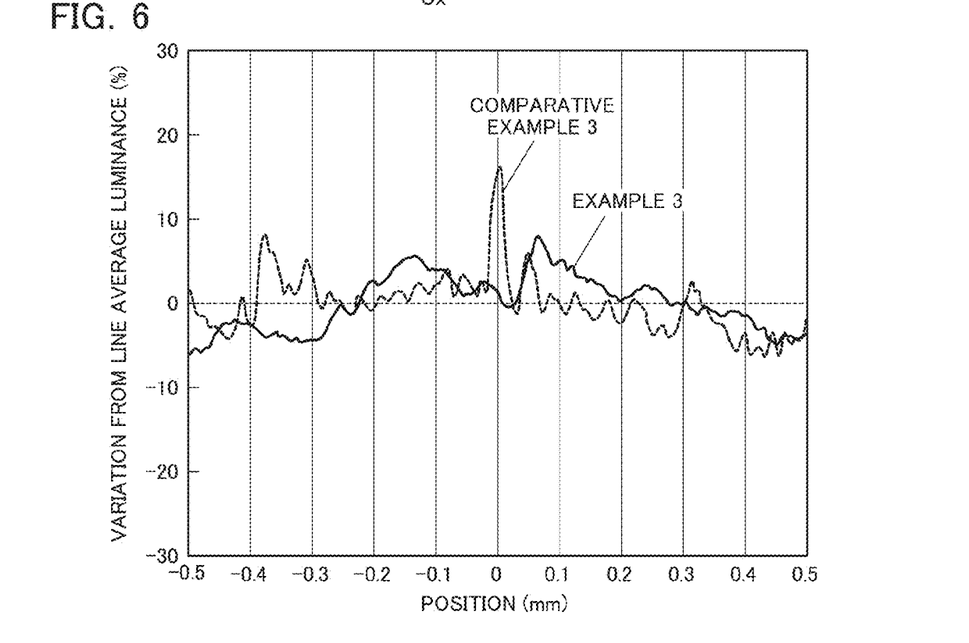
FIG. 6 is a luminance line analysis diagram on light-emitting surface during light emission from light-emitting device according to Example 3 and Comparative Example 3.

The light-emitting surface of the light-emitting device 1 including a ceramic composite for light conversion of a plate shape having a size of 1 mm×1 mm with a thickness selected so that the chromaticity Cy of the total luminous flux of light emitted by the light-emitting device fallen within the range of 0.35±0.005 was subjected to measurement of luminance distribution and chromaticity distribution at the light-emitting surface by means of a measurement system for luminance, illuminance, and chromaticity from Cybernet Systems Co., Ltd. The measured luminance distribution and chromaticity distribution at the light-emitting surface were subjected to line analyses (18 lines in total) of 9 lines for each of the horizontal and vertical directions at intervals of 0.1 mm, and the difference (variation) between the luminance or chromaticity on the line and the average value for the luminance or chromaticity at the surface was measured to figure out the maximum variation (largest variation). FIG. 6 shows an example of line analyses. The horizontal axis in the figure indicates a distance from the center of the light-emitting element, whereas the horizontal axis therein indicates a variation (%) in luminance when the average value for the luminance at the surface is used as a reference value (0). Where the maximum variation of the luminance or chromaticity on the line from the average value within ±10% is defined as a standard, it was determined that luminescence unevenness was suppressed unless there was a plurality of non-standard lines in which the maximum variation exceeds ±10%. In the light-emitting device including the ceramic composite for light conversion according to the present invention, the maximum value of the luminance distribution was larger than the maximum value of the chromaticity distribution. For that reason, the measurement result of the luminance line distribution was used for the determination of luminescence unevenness in all of examples and comparative examples of the present invention.

Example 1

An $\alpha$-$Al_2O_3$ powder (purity: 99.99%), a $Tb_4O_7$ powder (purity: 99.9%), and a $CeO_2$ powder (purity: 99.9%) were weighed respectively to be 0.773 mol in terms of $Al_{3/2}$, 0.227×0.997 mol in terms of $TbO_{7/4}$, and 0.227×0.003 mol. These powders were subjected to wet mixing in ethanol for 16 hours by means of a ball mill, and the ethanol as a solvent was then removed by means of an evaporator to obtain a raw material powder. The raw material powder was preliminarily melted in a vacuum furnace, which was regarded as a raw material for unidirectional solidification.

Next, this raw material was directly put in a molybdenum crucible, set in a melting retention zone of an unidirectional solidification system including the melting retention zone in the upper part thereof and a cooling zone in the lower part thereof in which a temperature gradient of 50° C./cm was set in a vertical direction (solidification direction), and melted under a pressure of $1.33 \times 10^{-3}$ Pa ($10^{-5}$ Torr). Next, in the same atmosphere, the molybdenum crucible was lowered at a rate of 5 mm/hour to cool the molybdenum crucible from the bottom, thereby obtaining a ceramic composite for light conversion according to Example 1, including $Tb_3Al_5O_{12}$ phase: Ce phase and an $Al_2O_2$ phase. Table 1 shows the fluorescence dominant wavelength and relative fluorescence intensity of the obtained ceramic composite for light conversion.

Figure 3:
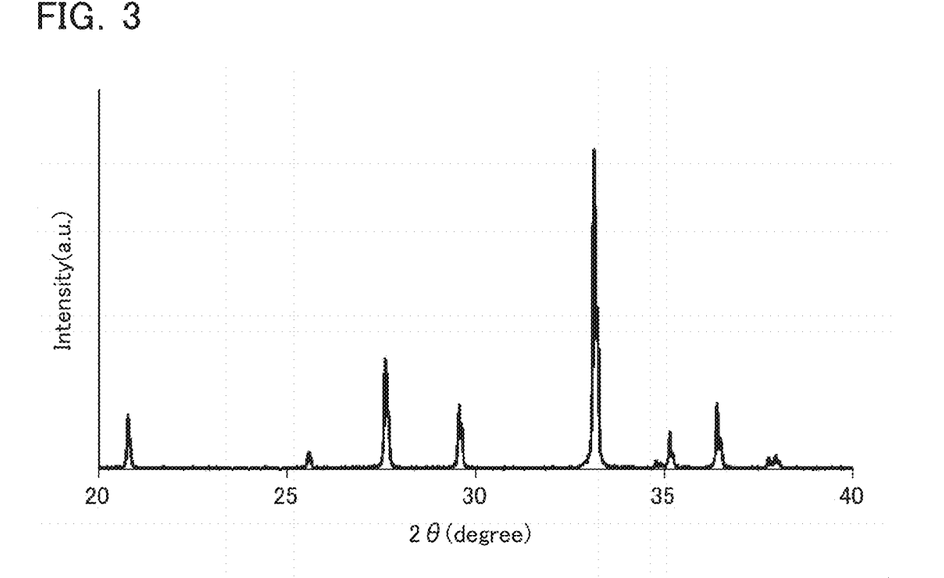
FIG. 3 is an X-ray diffraction diagram of a ceramic composite for light conversion according to Example 1.

Furthermore, FIG. 3 shows an X-ray diffraction diagram on a powder obtained by grinding the ceramic composite for light conversion according to Example 1. It has been confirmed that the ceramic composite for light conversion according to Example 1 has peaks for $Tb_3Al_5O_{12}$ and $Al_2O_3$. In addition, a cross section perpendicular to the solidification direction was subjected to an element analysis with a field-emission scanning electron microscope to confirm the presence of Ce in the $Tb_3Al_5O_{12}$ phase, and it has been thus confirmed that the ceramic composite for light conversion according to. Example 1 is formed of the $Tb_3Al_5O_{12}$ phase activated with Ce and the $Al_2O_3$ phase. FIG. 1 shows a photograph of a cross-sectional structure perpendicular to the solidification direction of the ceramic composite for light conversion according to Example 1. In FIG. 1 a white section A refers to the second phase ($Al_2O_3$ phase), whereas a white black section B refers to the first phase (the $Tb_3Al_5O_{12}$ phase activated with Ce).

Figure 5:
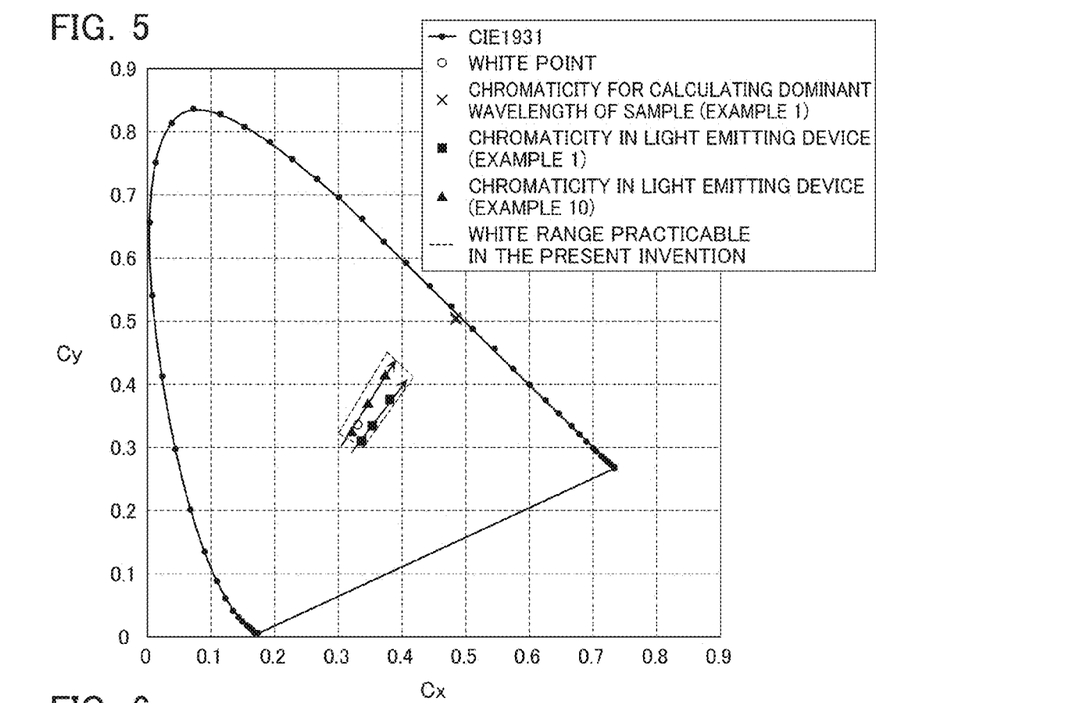
FIG. 5 is a CIE chromaticity diagram illustrating CIE chromaticity Cx and Cy of the total luminous flux emitted from a light-emitting device using a ceramic composite for light conversion according to the present invention.

Next, ceramic composites for light conversion of a plate shape and a size of 1 mm×1 mm of varying thickness were obtained from the ceramic composite for light conversion according to Example 1, and light-emitting devices including the ceramic composite for light conversion of a plate shape and a light-emitting element for emitting light with a peak at 463 nm were prepared for each thickness of the ceramic composites for light conversion. Then, chromaticity was measured from the total luminous fluxes taken into the integrating sphere when the light-emitting devices were allowed to emit light. The chromaticity plotted in FIG. 5 has chromaticity examples of light emitted by the light-emitting devices in the case of adjusting a thickness of the ceramic composites for light conversion of a plate shape to 0.15 mm, 0.20 mm, and 0.24 mm respectively in the order of chromaticity value from smallest to largest. It has been confirmed that when the thickness of the ceramic composite for light conversion of a plate shape falls at least within the range between 0.15 mm and 0.24 mm, the light-emitting device including the composite falls into the chromaticity of a white region. More specifically, it has been successfully confirmed through chromaticity that white light is achieved by the light-emitting device using the ceramic composite for light conversion according to Example 1. In addition, from the variation in chromaticity due to the thickness, it has been determined that the chromaticity Cy of light emitted by the light-emitting device can be adjusted to the chromaticity range of 0.30 to 0.41 as shown in FIG. 5 by adjusting the thickness of the ceramic composite for light conversion used in the light-emitting device.

Next, a graph with the chromaticity Cx and Cy as variables on two axes (graph 1) and a graph with the thickness of the sample and Cy as variables on two axes (graph 2) were drawn from the measured chromaticity Cx and Cy of light emitted by the light-emitting device and the thickness of the ceramic composite for light conversion of a plate shape. The thickness of the ceramic composite for light conversion of the plate shape and the chromaticity Cx in the case of chromaticity Cy=0.35 were respectively 0.22 mm and 0.37 which were obtained from an approximate line of the graph 1 and the graph 2.

Then, a ceramic composite for light conversion of a plate shape having a thickness for the chromaticity Cy: 0.35 of light emitted by the light-emitting device, that is, a thickness of 0.22 mm and a size of 1 mm×1 mm was obtained from the ceramic composite for light conversion according to Example 1. And then, a light-emitting device was prepared which was provided with the ceramic composite for light conversion of a plate shape and a light-emitting element for emitting light with a peak at 463 nm. Next, this light-emitting device was allowed to emit light for measuring luminance distribution and chromaticity distribution at the light-emitting surface, and evaluating luminescence unevenness. The results are shown in Table 1.

Example 2

Raw materials, an $\alpha$-$Al_2O_3$ powder (purity: 99.99%), a $Tb_4O_7$ powder (purity: 99.9%), and a $CeO_2$ powder (purity: 99.9%) were weighed respectively to be 0.773 mol in terms of $Al_{3/2}$, 0.227×0.994 mol in terms of $TbO_{7/4}$, and 0.227×0.006 mol. As for the rest, except that the transfer rate of the molybdenum crucible was adjusted to 10 mm/hour, a ceramic composite for light conversion according to Example 2 was obtained in the same way as in Example 1. In the same way as in Example 1, it was confirmed that the ceramic composite for light conversion according to Example 2 is formed of a $Tb_3Al_5O_{12}$ phase activated with Ce and an $Al_2O_3$ phase. Table 1 shows the fluorescence dominant wavelength and relative fluorescence intensity of the obtained ceramic composite for light conversion.

Except for adjusting the thicknesses of the ceramic composites for light conversion of a plate shape to 0.14 mm, 0.19 mm, and 0.24 mm, light-emitting devices were prepared for each thickness of the ceramic composites for light conversion in the same way as in Example 1, and the chromaticity Cx and Cy of light emitted by the light-emitting devices was measured in the same way as in Example 1. The thickness of the ceramic composite for light conversion of a plate shape and the chromaticity Cx in the case of chromaticity Cy=0.35 were obtained in the same way as in Example 1, and luminescence unevenness was determined in the same way as in Example 1. Table 1 shows the thickness of the ceramic composite for light conversion of a plate shape and the chromaticity Cx in the case of chromaticity Cy=0.35, as well as the result of determining luminescence unevenness.

Example 3

An $\alpha$-$Al_2O_2$ powder (purity: 99.99%), a $Tb_4O_7$ powder (purity: 99.9%), and a $CeO_2$ powder (purity: 99.9%) were weighed respectively to be 0.773 mol in terms of $AlO_{3/2}$, 0.227×0.99 mol in terms of $TbO_{7/4}$, and 0.227×0.01 mol. As for the rest, except that the transfer rate of the molybdenum crucible was adjusted to 10 mm/hour, a ceramic composite for light conversion was obtained in the same way as in Example 1. In the same way as in Example 1, it was confirmed that the ceramic composite for light conversion according to Example 3 is formed of a $Tb_3Al_5O_{12}$ phase activated with Ce and an $Al_2O_3$ phase. Table 1 shows the fluorescence dominant wavelength and relative fluorescence intensity of the obtained ceramic composite for light conversion.

In addition, except that the thicknesses of the ceramic composites for light conversion of the plate shape were adjusted to 0.10 mm, 0.15 mm, and 0.19 mm to prepare light-emitting devices, the thickness of the ceramic composite for light conversion of the plate shape and the chromaticity Cx in the case of chromaticity Cy=0.35, as well as luminescence unevenness were determined in the same way as in Example 1. The results are shown in Table 1.

Example 4

An $\alpha$-$Al_2O_3$ powder (purity: 99.99%), a $Tb_4O_7$ powder (purity: 99.9%), a $Y_2O_3$ powder (purity: 99.9%), and a $CeO_2$ powder (purity: 99.9%) were weighed respectively to be 0.773 mol in terms of $AlO_{3/2}$, 0.227×0.99×0.4 mol in terms of $TbO_{7/4}$, 0.227×0.99×0.6 mol in terms of $YO_{3/2}$, and 0.227×0.01 mol. As for the rest, except that the transfer rate of the molybdenum crucible was adjusted to 10 mm/hour, a ceramic composite for light conversion was obtained in the same way as in Example 1. In the same way as in Example 1, it was confirmed that the ceramic composite for light conversion according to Example 4 is formed of a $(Tb, Y)_3Al_5O_{12}$ phase activated with Ce and an $Al_2O_3$ phase. Table 1 shows the fluorescence dominant wavelength and relative fluorescence intensity of the obtained ceramic composite for light conversion.

In addition, the thickness of the ceramic composite for light conversion of the plate shape and the chromaticity Cx in the case of chromaticity Cy=0.35, as well as luminescence unevenness were determined in the same way as in Example 3. The results are shown in Table 1.

Example 5

Except that an α-$Al_2O_3$ powder (purity: 99.99%), a $Tb_4O_7$ powder (purity: 99.9%), a $Y_2O_3$ powder (purity: 99.9%), and a $CeO_2$ powder (purity: 99.9%) were weighed respectively to be 0.808 mol in terms of $AlO_{3/2}$, 0.192×0.998×0.3 mol in terms of $TbO_{7/4}$, 0.192×0.998×0.7 mol in terms of $YO_{3/2}$, and 0.192×0.002 mol, a ceramic composite for light conversion was obtained in the same way as in Example 1. In the same way as in Example 1, it was confirmed that the ceramic composite for light conversion according to Example 5 is formed of a $(Tb, Y)_3Al_5O_{12}$ phase activated with Ce and an $Al_2O_3$ phase. Table 1 shows the fluorescence dominant wavelength and relative fluorescence intensity of the obtained ceramic composite for light conversion.

In addition, except that the thicknesses of the ceramic composites for light conversion of the plate shape were adjusted to 0.20 mm, 0.35 mm, and 0.50 mm to prepare light-emitting devices, the thickness of the ceramic composite for light conversion of the plate shape and the chromaticity Cx in the case of chromaticity Cy=0.35, as well as luminescence unevenness were determined in the same way as in Example 1. The results are shown in Table 1.

Example 6

Except that raw materials, an α-$Al_2O_3$ powder (purity: 99.99%), a $Tb_4O_7$ powder (purity: 99.9%), a $Y_2O_3$ powder (purity: 99.9%), and a $CeO_2$ powder (purity: 99.9%) were weighed respectively to be 0.800 mol in terms of $AlO_{3/2}$, 0.200×0.998×0.225 mol in terms of $TbO_{7/4}$, 0.200×0.998×0.775 mol in terms of $YO_{3/2}$, and 0.200×0.002 mol, a ceramic composite for light conversion was obtained in the same way as in Example 1. In the same way as in Example 1, it was confirmed that the ceramic composite for light conversion according to Example 6 is formed of a $(Tb, Y)_3Al_5O_{12}$ phase activated with Ce and an $Al_2O_3$ phase. Table 1 shows the fluorescence dominant wavelength and relative fluorescence intensity of the obtained ceramic composite for light conversion.

In addition, the thickness of the ceramic composite for light conversion of the plate shape and the chromaticity Cx in the case of chromaticity Cy=0.35, as well as luminescence unevenness were determined in the same way as in Example 5. The results are shown in Table 1.

Example 7

Except that raw materials, an α-$Al_2O_3$ powder (purity: 99.99%), a $Tb_4O_7$ powder (purity: 99.9%), a $Y_2O_3$ powder (purity: 99.9%), and a $CeO_2$ powder (purity: 99.9%) were weighed respectively to be 0.788 mol in terms of $AlO_{3/2}$, 0.212×0.982×0.4 mol in terms of $TbO_{7/4}$, 0.212×0.982×0.6 mol in terms of $YO_{3/2}$, and 0.212×0.018 mol, a ceramic composite for light conversion was obtained in the same way as in Example 1. In the same way as in Example 1, it was confirmed that the ceramic composite for light conversion according to Example 7 is formed of a $(Tb, Y)_3Al_5O_{12}$ phase activated with Ce and an $Al_2O_3$ phase. Table 1 shows the fluorescence dominant wavelength and relative fluorescence intensity of the obtained ceramic composite for light conversion.

In addition, except that the thicknesses of the ceramic composites for light conversion of the plate shape were adjusted to 0.08 mm, 0.14 mm, and 0.18 mm to prepare light-emitting devices, the thickness of the ceramic composite for light conversion of the plate shape and the chromaticity Cx in the case of chromaticity Cy=0.35, as well as luminescence unevenness were determined in the same way as in Example 1. The results are shown in Table 1.

Example 8

Except that raw materials, an α-$Al_2O_3$ powder (purity: 99.99%), a $Tb_4O_7$ powder (purity: 99.9%), and a $CeO_2$ powder (purity: 99.9%) were weighed respectively to be 0.808 mol in terms of $AlO_{3/2}$, 0.192×0.985 mol in terms of $TbO_{7/4}$, and 0.192×0.015 mol, a ceramic composite for light conversion was obtained in the same way as in Example 1. In the same way as in Example 1, it was confirmed that the ceramic composite for light conversion according to Example 8 is formed of a $Tb_3Al_5O_{12}$ phase activated with Ce and an $Al_2O_3$ phase. Table 1 shows the fluorescence dominant wavelength and relative fluorescence intensity of the obtained ceramic composite for light conversion.

In addition, the thickness of the ceramic composite for light conversion of the plate shape and the chromaticity Cx in the case of chromaticity Cy=0.35, as well as luminescence unevenness were determined in the same way as in Example 7. The results are shown in Table 1.

Example 9

Except that raw materials, an α-$Al_2O_3$ powder (purity: 99.99%), a $Tb_4O_7$ powder (purity: 99.9%), and a $CeO_2$ powder (purity: 99.9%) were weighed respectively to be 0.773 mol in terms of $AlO_{3/2}$, 0.227×0.977×0.4 mol in terms of $TbO_{7/4}$, and 0.227×0.023 mol, a ceramic composite for light conversion was obtained in the same way as in Example 1. In the same way as in Example 1, it was confirmed that the ceramic composite for light conversion according to Example 9 is formed of a $Tb_3Al_5O_{12}$ phase activated with Ce and an $Al_2O_3$ phase. Table 1 shows the fluorescence dominant wavelength and relative fluorescence intensity of the obtained ceramic composite for light conversion.

In addition, the thickness of the ceramic composite for light conversion of the plate shape and the chromaticity Cx in the case of chromaticity Cy=0.35, as well as luminescence unevenness were determined in the same way as in Example 7. The results are shown in Table 1.

Example 10

Except that raw materials, an α-$Al_2O_3$ powder (purity: 99.99%), a $Tb_4O_7$ powder (purity: 99.9%), a $Y_2O_3$ powder (purity: 99.9%), and a $CeO_2$ powder (purity: 99.9%) were weighed respectively to be 0.808 mol in terms of $AlO_{3/2}$, 0.192×0.98×0.225 mol in terms of $TbO_{7/4}$, 0.192×0.98×0.775 mol in terms of $YO_{3/2}$, and 0.192×0.02 mol, a ceramic composite for light conversion was obtained in the same way as in Example 1. In the same way as in Example 1, it was confirmed that the ceramic composite for light conversion according to Example 10 is formed of a $(Tb, Y)_3Al_5O_{12}$ phase activated with Ce and an $Al_2O_3$ phase. Table 1 shows the fluorescence dominant wavelength and relative fluorescence intensity of the obtained ceramic composite for light conversion.

In addition, except that the thicknesses of the ceramic composites for light conversion of the plate shape were adjusted to 0.08 mm, 0.10 mm, and 0.13 mm to prepare light-emitting devices, the thickness of the ceramic composite for light conversion of the plate shape and the chromaticity Cx in the case of chromaticity Cy=0.35, as well as luminescence unevenness were determined in the same way as in Example 1. The results are shown in Table 1. In addition, the chromaticity plotted in FIG. 5 has chromaticity examples of the light-emitting devices in the case of adjusting the samples to 0.08 mm, 0.10 mm, and 0.13 mm in thickness respectively in the order of chromaticity value from smallest to largest.

Example 11

Except that raw materials, an α-$Al_2O_3$ powder (purity: 99.99%), a $Tb_4O_7$ powder (purity: 99.9%), a $Y_2O_3$ powder (purity: 99.9%), and a $CeO_2$ powder (purity: 99.9%) were weighed respectively to be 0.800 mol in terms of $AlO_{3/2}$, 0.200×0.997×0.2 mol in terms of $TbO_{7/4}$, 0.200×0.997×0.8 mol in terms of $YO_{3/2}$, and 0.200×0.003 mol, a ceramic composite for light conversion was obtained in the same way as in Example 1. In the same way as in Example 1, it was confirmed that the ceramic composite for light conversion according to Example 11 is formed of a $(Tb, Y)_3Al_5O_{12}$ phase activated with Ce and an $Al_2O_3$ phase. Table 1 shows the fluorescence dominant wavelength and relative fluorescence intensity of the obtained ceramic composite for light conversion. The obtained fluorescence dominant wavelength was 570 nm.

In addition, the thickness of the ceramic composite for light conversion of the plate shape and the chromaticity Cx in the case of chromaticity Cy=0.35, as well as luminescence unevenness were determined in the same way as in Example 5. The results are shown in Table 1.

Example 12

An α-$Al_2O_3$ powder (purity: 99.99%), a $Tb_4O_7$ powder (purity: 99.9%), and a $CeO_2$ powder (purity: 99.9%) were weighed respectively to be 0.773 mol in terms of $AlO_{3/2}$, 0.227×0.975 mol in terms of $TbO_{7/4}$, and 0.227×0.025 mol. As for the rest, except that the transfer rate of the molybdenum crucible was adjusted to 10 mm/hour, a ceramic composite for light conversion was obtained in the same way as in Example 1. In the same way as in Example 1, it was confirmed that the ceramic composite for light conversion according to Example 12 is formed of a $Tb_3Al_5O_{12}$ phase activated with Ce and an $Al_2O_3$ phase. Table 1 shows the fluorescence dominant wavelength and relative fluorescence intensity of the obtained ceramic composite for light conversion.

In addition, the thickness of the ceramic composite for light conversion of the plate shape and the chromaticity Cx in the case of chromaticity Cy=0.35, as well as luminescence unevenness were determined in the same way as in Example 7. The results are shown in Table 1. The thickness less than 80 μm produce a difference in chromaticity due to a slight variation in sample thickness, thus, in order to keep light emitted by the white light-emitting device at constant chromaticity, there is a need to equalize the thicknesses of the plate-like ceramic composites for light conversion with a high degree of precision, and there is a need to control, with a high degree of precision, processing for adjusting the thicknesses of the plate-like ceramic composites for light conversion.

Comparative Example 1

Except that raw materials, an α-$Al_2O_3$ powder (purity: 99.99%), a $Y_2O_3$ powder (purity: 99.9%), and a $CeO_2$ powder (purity: 99.9%) were weighed respectively to be 0.813 mol in terms of $AlO_{3/2}$, 0.187×0.997 mol in terms of $YO_{3/2}$, and 0.187×0.003 mol, a ceramic composite for light conversion was obtained in the same way as in Example 1. A cross section perpendicular to the solidification direction was subjected to an element analysis with a field-emission scanning electron microscope to confirm the presence of Ce in a $Y_3Al_5O_{12}$ phase, and it has been thus confirmed that the ceramic composite for light conversion according to Comparative Example 1 is formed of the $Y_3Al_5O_{12}$ phase activated with Ce and an $Al_2O_3$ phase. Table 1 shows the fluorescence dominant wavelength, relative fluorescence intensity of the obtained ceramic composite for light conversion, the thickness and chromaticity Cx of the ceramic composite for light conversion at chromaticity Cy=0.35 in the case of a LED, and the result of determining luminescence unevenness. In spite of little luminescence unevenness of the obtained ceramic composite for light conversion, the fluorescence dominant wavelength was 568 nm.

Comparative Example 2

Except that raw materials, an α-$Al_2O_3$ powder (purity: 99.99%), a $Y_2O_3$ powder (purity: 99.9%), and a $CeO_2$ powder (purity: 99.9%) were weighed respectively to be 0.808 mol in terms of $AlO_{3/2}$, 0.192×0.99 mol in terms of $YO_{3/2}$, and 0.192×0.01 mol, a ceramic composite for light conversion was obtained in the same way as in Example 1. In the same way as in Comparative Example 1, it was confirmed that the ceramic composite for light conversion according to Comparative Example 2 is formed of a $Y_3Al_5O_{12}$ phase activated with Ce and an $Al_2O_3$ phase. Table 1 shows the fluorescence dominant wavelength, relative fluorescence intensity of the obtained ceramic composite for light conversion, the thickness and chromaticity Cx of the ceramic composite for light conversion at chromaticity Cy=0.35 in the case of a LED, and the result of determining luminescence unevenness. The fluorescence dominant wavelength of the obtained ceramic composite for light conversion was 571 nm. While the fluorescence dominant wavelength was 570 nm or more under the influence of the high Ce proportion, the luminescence unevenness was significant.

Comparative Example 3

Except that raw materials, an α-$Al_2O_3$ powder (purity: 99.99%), a $Y_2O_3$ powder (purity: 99.9%), a $Gd_2O_3$ powder (purity: 99.9%), and a $CeO_2$ powder (purity: 99.9%) were weighed respectively to be 0.808 mol in terms of $AlO_{3/2}$, 0.192×0.89 mol in terms of $YO_{3/2}$, 0.192×0.10 mol in terms of $GdO_{3/2}$, and 0.187×0.01 mol, a ceramic composite for light conversion was obtained in the same way as in Example 1. A cross section perpendicular to the solidification direction was subjected to an element analysis with a field-emission scanning electron microscope to confirm the presence of Ce in a $(Y, Gd)_3Al_5O_{12}$ phase, and it has been thus confirmed that the ceramic composite for light conversion according to Comparative Example 3 is formed of the $(Y, Gd)_3Al_5O_{12}$ phase activated with Ce and an $Al_2O_3$ phase.

It is to be noted that the compositions of the Gd-containing ceramic composite for light conversion according to Comparative Examples 3 and 4 are expressed by the following formula (2), and the ratio between $GdO_{3/2}$ and $YO_{3/2}$ is shown as a'/b' in Table 1.

[Formula 3]

$$AlO_{3/2}\text{-}x\cdot(a'\cdot GdO_{3/2}\text{-}b'\cdot YO_{3/2}\text{-}c\cdot CeO_2) \tag{2}$$

Table 1 shows the fluorescence dominant wavelength, relative fluorescence intensity of the obtained ceramic composite for light conversion, the thickness and chromaticity Cx of the ceramic composite for light conversion at chromaticity Cy=0.35 in the case of a LED, and the result of determining luminescence unevenness. While the fluorescence dominant wavelength of the obtained ceramic composite for light conversion was increased to 574 nm under the influence of Gd, the luminescence unevenness was more significant than in Comparative Example 2.

Comparative Example 4

Except that raw materials, an $\alpha\text{-}Al_2O_3$ powder (purity: 99.99%), a $Y_2O_3$ powder (purity: 99.9%), a $Gd_2O_3$ powder (purity: 99.9%), and a $CeO_2$ powder (purity: 99.9%) were weighed respectively to be 0.808 mol in terms of $AlO_{3/2}$, 0.192×0.86 mol in terms of $YO_{3/2}$, 0.192×0.10 mol in terms of $GdO_{3/2}$, and 0.192×0.04 mol, a ceramic composite for light conversion was obtained in the same way as in Example 1. In the same way as in Comparative Example 3, it was confirmed that the ceramic composite for light conversion according to Comparative Example 4 is formed of a $(Y, Gd)_3Al_5O_{12}$ phase activated with Ce and an $Al_2O_3$ phase. Table 1 shows the fluorescence dominant wavelength, relative fluorescence intensity of the obtained ceramic composite for light conversion, the thickness and chromaticity Cx of the ceramic composite for light conversion at chromaticity Cy=0.35 in the case of a LED, and the result of determining luminescence unevenness. While the fluorescence dominant wavelength of the obtained ceramic composite for light conversion was increased to 575 nm under the influence of Gd, the luminescence unevenness was far more significant than in Comparative Example 3 with the Gd proportion lower than in Comparative Example 4.

Comparative Example 5

Except that raw materials, an $\alpha\text{-}Al_2O_3$ powder (purity: 99.99%), a $Tb_4O_7$ powder (purity: 99.9%), and a $CeO_2$ powder (purity: 99.9%) were weighed respectively to be 0.813 mol in terms of $AlO_{3/2}$, 0.187×0.99 mol in terms of $TbO_{7/4}$, and 0.187×0.01 mol, a ceramic composite for light conversion was obtained in the same way as in Example 1. Table 1 shows the fluorescence dominant wavelength, relative fluorescence intensity of the obtained ceramic composite for light conversion, the thickness and chromaticity Cx of the ceramic composite for light conversion at chromaticity Cy=0.35 in the case of a LED, and the result of determining luminescence unevenness. The obtained ceramic composite for light conversion, including a non-uniform structure with coarse initial crystals of $Al_2O_3$ produced extensively, varied significantly in chromaticity for each sample, and thus, was not appropriate as a ceramic composite for light conversion for use in a white light-emitting device.

Comparative Example 6

Except that raw materials, an $\alpha\text{-}Al_2O_3$ powder (purity: 99.99%), a $Tb_4O_7$ powder (purity: 99.9%), a $Y_2O_3$ powder (purity: 99.9%), and a $CeO_2$ powder (purity: 99.9%) were weighed respectively to be 0.769 mol in terms of $AlO_{3/2}$, 0.231×0.99×0.25 mol in terms of $TbO_{7/4}$, 0.231×0.99×0.75 mol in terms of $YO_{3/2}$, and 0.231×0.01 mol, a ceramic composite for light conversion was obtained in the same way as in Example 1. The solidified body obtained had a plurality of cracks, thereby resulting in failure to obtain any disk-shaped sample of φ16 mm×0.2 mm as shown in Table 1.

Comparative Example 7

Except that raw materials, an $\alpha\text{-}Al_2O_3$ powder (purity: 99.99%), a $Tb_4O_7$ powder (purity: 99.9%), and a $CeO_2$ powder (purity: 99.9%) were weighed respectively to be 0.76 mol in terms of $AlO_{3/2}$, 0.24×0.98 mol in terms of $TbO_{7/4}$, and 0.24×0.02 mol, a ceramic composite for light conversion was obtained in the same way as in Example 1. Table 1 shows the fluorescence dominant wavelength, relative fluorescence intensity of the obtained ceramic composite for light conversion, the thickness and chromaticity Cx of the ceramic composite for light conversion at chromaticity Cy=0.35 in the case of a LED, and the result of determining luminescence unevenness. There were a plurality of nonstandard lines, and it was determined that the suppression of luminescence unevenness was not sufficient.

Comparative Example 8

Except that raw materials, an $\alpha\text{-}Al_2O_3$ powder (purity: 99.99%), a $Tb_4O_7$ powder (purity: 99.9%), a $Y_2O_3$ powder (purity: 99.9%), and a $CeO_2$ powder (purity: 99.9%) were weighed respectively to be 0.808 mol in terms of $AlO_{3/2}$, 0.192×0.97×0.5 mol in terms of $TbO_{7/4}$, 0.192×0.97×0.5 mol in terms of $YO_{3/2}$, and 0.192×0.03 mol, a ceramic composite for light conversion was obtained in the same way as in Example 1. While the fluorescence dominant wavelength and the relative fluorescence intensity were able to be measured in regard to the disk-shaped sample obtained, the high chromaticity Cx and Cy of the total luminous fluxes emitted from the light-emitting devices in regard to all of the plate-shaped samples failed to fall into any white region as shown in Table 1. For this reason, it was not possible to calculate the thickness or chromaticity Cx of the ceramic composite for light conversion at chromaticity Cy=0.35 in the case of a LED.

TABLE 1

| | x | b/a | a'/b' | c | Dominant Wavelength (nm) | Fluorescece Intensity (Comparative Example 1 Regarded as 100) | Thickness for LED (mm) (at Cy = 0.36) | White Chromaticity Cx (at Cy = 0.35) | The Number of Non-Standard Lines |
|---|---|---|---|---|---|---|---|---|---|
| Example 1 | 0.294 | 0.0 | — | 0.003 | 577 | 125 | 0.22 | 0.37 | 0/18 |
| Example 2 | 0.294 | 0.0 | — | 0.006 | 577 | 135 | 0.18 | 0.37 | 0/18 |
| Example 3 | 0.294 | 0.0 | — | 0.01 | 577 | 141 | 0.12 | 0.37 | 0/18 |
| Example 4 | 0.294 | 1.5 | — | 0.01 | 576 | 139 | 0.14 | 0.86 | 0/18 |
| Example 5 | 0.238 | 2.3 | — | 0.002 | 573 | 103 | 0.40 | 0.34 | 0/18 |
| Example 6 | 0.250 | 2.4 | — | 0.002 | 572 | 101 | 0.40 | 0.33 | 0/18 |
| Example 7 | 0.269 | 1.5 | — | 0.018 | 576 | 148 | 0.09 | 0.36 | 1/18 |
| Example 8 | 0.238 | 0.0 | — | 0.015 | 576 | 140 | 0.11 | 0.36 | 0/18 |
| Example 9 | 0.294 | 0.0 | — | 0.023 | 577 | 144 | 0.08 | 0.37 | 0/18 |
| Example 10 | 0.258 | 2.4 | — | 0.02 | 572 | 142 | 0.08 | 0.33 | 0/18 |
| Example 11 | 0.250 | 0.0 | — | 0.003 | 575 | 99 | 0.40 | 0.32 | 0/18 |
| Example 12 | 0.294 | 0.0 | — | 0.025 | 677 | 146 | 0.02 | 0.37 | 1/18 |
| Comparative Example 1 | 0.248 | — | 0.0 | 0.003 | 568 | 100 | 1.10 | 0.31 | 0/18 |
| Comparative Example 2 | 0.263 | — | 0.0 | 0.01 | 571 | 139 | 0.18 | 0.92 | 4/18 |
| Comparative Example 3 | 0.269 | — | 0.1 | 0.01 | 574 | 128 | 0.16 | 0.54 | 18/18 |
| Comparative Example 4 | 0.263 | — | 0.1 | 0.04 | 575 | 138 | 0.08 | 0.30 | 18/18 |
| Comparative Example 5 | 0.230 | 0.0 | — | 0.01 | significant variations | | — | — | — |
| Comparative Example 6 | 0.300 | 3.0 | — | 0.01 | unmeasurable | | — | — | — |
| Comparative Example 7 | 0.316 | 0.0 | — | 0.02 | 577 | 144 | 0.08 | 0.37 | 8/18 |
| Comparative Example 8 | 0.238 | 1.0 | — | 0.03 | 575 | 150 | failure to calculate (outside white region) | | — |

From the foregoing, it is found that the range for white light emissions obtained by adjusting the thicknesses of the ceramic composites for light conversion according to the examples has a region surrounded by (0.30, 0.32), (0.34, 0.30), (0.42, 0.41), and (0.38, 0.45) in the CIE chromaticity (Cx, Cy) shown in FIG. 5 in the case of the light-emitting device using the ceramic composite for light conversion according to the present invention.

Figure 4:
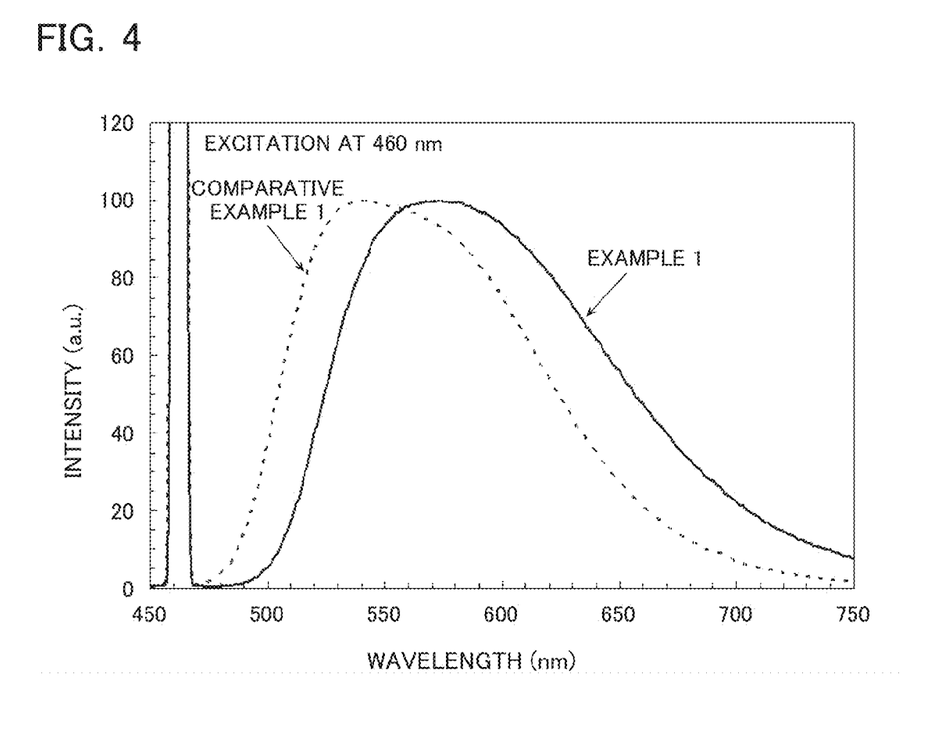
FIG. 4 is fluorescence spectra of ceramic composites for light conversion according to Example 1 and Comparative Example 1.

Furthermore, FIG. 4 shows a fluorescence spectrum of the ceramic composite for light conversion according to Example 1, in conjunction with a fluorescence spectrum of the ceramic composite for light conversion according to Comparative Example 1 with a fluorescence dominant wavelength of 568 nm. It is found that the fluorescence spectrum of the ceramic composite for light conversion according to Example 1 with a long fluorescence dominant wavelength is shifted to the long wavelength side with respect to the fluorescence spectrum of the ceramic composite for light conversion according to Comparative Example 1 with a short fluorescence dominant wavelength.

Furthermore, FIG. 6 is a diagram showing an example of a line analysis on the luminance at a light-emitting surface of a light-emitting device including the ceramic composite for light conversion according to Example 3, in conjunction with an example according to Comparative Example 3. It is found that Example 3 varies insignificantly from place to place, and has the maximum variation within the standards, as compared with Comparative Example 3. As just described, it has been confirmed that luminescence unevenness is suppressed with the maximum variation within the standards in the line analysis for all of the 18 lines in Example 3.

Accordingly, it is found that the ceramic composite for light conversion according to the present invention is a ceramic composite for light conversion, which is able to arbitrarily adjust the fluorescence dominant wavelength through x and/or b/a in the formula (1), and high in relative fluorescence intensity even when the fluorescence dominant wavelength is a long wavelength, further with luminescence unevenness suppressed, and used in a preferred manner in a white light-emitting device.

REFERENCE SIGNS LIST 1 light-emitting device
2 single crystal substrate
3 ceramic composite for light conversion
4 light-emitting element (light-emitting diode element)
5, 6 electrode
7 package

The invention claimed is:

1. A ceramic composite for light conversion, which is formed of a solidified body comprising a composition expressed by the following formula (1), the composition having a structure where at least two oxide phases of a first phase and a second phase are continuously and three-dimensionally entangled mutually, the first phase being a $(Tb, Y)_3Al_5O_{12}$ phase activated with Ce for producing fluorescence, and
the second phase being an $Al_2O_3$ phase,

[Formula 1]

$$AlO_{3/2} \text{-} x \cdot (a \cdot TbO_{7/4} \text{-} b \cdot YO_{3/2} \text{-} c \cdot CeO_2) \quad (1)$$

in which x satisfies $0.23 < x < 0.30$, and a, b, and c represent mole fractions, and satisfy $0 \leq b/a \leq 4$, $0 < c \leq 0.025$, and $a+b+c=1$.

2. The ceramic composite for light conversion according to claim 1, wherein c in the formula (1) satisfies $0.002 \leq c \leq 0.02$, and which has a plate shape and a thickness of 80 μm or more and 400 μm or less in a light-emitting direction.

3. The ceramic composite for light conversion according to claim 1, wherein the composite absorbs light having a peak at a wavelength of 420 to 500 nm and emits fluorescence having a dominant wavelength at 570 to 580 nm.

4. The ceramic composite for light conversion according to claim 2, wherein the composite absorbs light having a peak at a wavelength of 420 to 500 nm and emits fluorescence having a dominant wavelength at 570 to 580 nm.

5. The ceramic composite for light conversion according to claim 3, wherein the composite receives light having a peak at a wavelength of 420 to 500 nm, emits fluorescence converted from some of the light as excitation light, and transmits some of the light to emit transmitted light, and the fluorescence and the transmitted light are mixed to emit white light.

6. The ceramic composite for light conversion according to claim 4, wherein the white light has chromaticity in a region surrounded by (0.30, 0.32), (0.34, 0.30), (0.42, 0.41), and (0.38, 0.45) in CIE chromaticity coordinates (Cx, Cy).

7. A light-emitting device comprising a light-emitting element and the ceramic composite for light conversion according to claim 1.

8. A light-emitting device comprising a light-emitting element having a peak at a wavelength 420 to 500 nm, and the ceramic composite for light conversion according to claim 1 for emitting fluorescence having a dominant wavelength between 570 nm and 580 nm.

9. The light-emitting device according to claim 6, wherein the light-emitting element is a light-emitting diode element.

10. The light-emitting device according to claim 7, wherein the light-emitting element is a light-emitting diode element.

* * * * *